(12) United States Patent
Shimizu et al.

(10) Patent No.: US 7,978,963 B2
(45) Date of Patent: Jul. 12, 2011

(54) THERMAL PROCESSING APPARATUS

(75) Inventors: Masahiro Shimizu, Nirasaki (JP); Shigeru Kasai, Nirasaki (JP); Masatake Yoneda, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 1103 days.

(21) Appl. No.: 10/573,048

(22) PCT Filed: Sep. 24, 2004

(86) PCT No.: PCT/JP2004/013922
§ 371 (c)(1),
(2), (4) Date: May 4, 2007

(87) PCT Pub. No.: WO2005/029561
PCT Pub. Date: Mar. 31, 2005

(65) Prior Publication Data
US 2011/0002674 A1     Jan. 6, 2011

(30) Foreign Application Priority Data
Sep. 24, 2003   (JP) ................................. 2003-332482

(51) Int. Cl.
*F26B 3/30* (2006.01)
*A21B 1/22* (2006.01)
*C23C 16/00* (2006.01)
(52) U.S. Cl. .................. 392/411; 219/405; 118/724
(58) Field of Classification Search .......... 392/407–440; 219/405; 118/722–725
See application file for complete search history.

(56) References Cited

U.S. PATENT DOCUMENTS

| | | | | |
|---|---|---|---|---|
| 6,403,924 | B1 * | 6/2002 | Hayashi | 219/390 |
| 7,107,929 | B2 * | 9/2006 | Horsky et al. | 118/723 CB |
| 7,274,867 | B2 * | 9/2007 | Peukert | 392/416 |
| 7,846,255 | B2 * | 12/2010 | Yoneda et al. | 118/725 |
| 2003/0080104 | A1 | 5/2003 | Kusuda | |

(Continued)

FOREIGN PATENT DOCUMENTS
JP         62-15816         1/1987
(Continued)

OTHER PUBLICATIONS

Notification of Transmittal of Translation of the International Preliminary Report on Patentability (Form PCT/IB/338), in connection with PCT/JP2004/013922, dated Jan. 2004.

(Continued)

*Primary Examiner* — Daniel Robinson
(74) *Attorney, Agent, or Firm* — Smith, Gambrell & Russell, LLP

(57) ABSTRACT

The present invention provides a thermal processing apparatus that conducts a thermal process such as an annealing process at a temperature of 400° C. or more to an object to be processed. The apparatus is provided with a processing vessel (4) having a transmitting window (8) in a top part thereof. A table (10) is disposed in the vessel, that supports thereon the object (W) opposed to the transmitting window. A plurality of heating lamps (42A, 42B) are disposed above the processing vessel, that heat the object by irradiating heat rays to the object through the transmitting window. A thermoelectric converter (24) is disposed on the table and configured to at least cool the object. When a temperature of the object is increased, the object is mainly heated by the heat rays from the heating lamps. When the temperature of the object is decreased, the object is forcibly cooled by means of the thermoelectric converter.

4 Claims, 12 Drawing Sheets

U.S. PATENT DOCUMENTS

| | | |
|---|---|---|
| 2003/0089132 A1 | 5/2003 | Kusuda |
| 2008/0226272 A1* | 9/2008 | Kasai et al. ............... 392/418 |
| 2010/0150534 A1* | 6/2010 | Kasai ............................ 392/416 |

FOREIGN PATENT DOCUMENTS

| | | |
|---|---|---|
| JP | 04-010410 | 1/1992 |
| JP | 06-268053 | 9/1994 |
| JP | 08-213337 | 8/1996 |
| JP | 9-205080 | 8/1997 |
| JP | 2001-085408 | 3/2001 |
| JP | 2002-151428 | 5/2002 |
| JP | 2002-151487 | 5/2002 |
| JP | 2002-299319 | 10/2002 |
| JP | 2003-133249 | 5/2003 |
| JP | 2003-209054 | 7/2003 |

OTHER PUBLICATIONS

Translation of International Preliminary Report on Patentability (Form PCT/IPEA/409), in connection with PCT/JP2004/013922, dated Jan. 2004.

Japanese Office Action issued on Sep. 15, 2009 for Japanese Application No. 2003-332482 w/ English translation.

* cited by examiner

THERMAL PROCESSING APPARATUS

TECHNICAL FIELD

The present invention relates to a thermal processing apparatus that conducts thermal processes, such as an annealing process and a film-deposition process, to an object to be processed, e.g., a semiconductor wafer.

BACKGROUND ART

When a semiconductor device is manufactured, a semiconductor wafer is generally, repeatedly subjected to various thermal processes such as a film-deposition process, pattern-etching process, oxidation and diffusion process, modification process, annealing process, and so on, so as to manufacture a desired device. In the light of the recent demand for higher density, the increased number of layers, and higher integration of the semiconductor device, the semiconductor device should have strict specifications. In particular, an improvement in a wafer intra-surface uniformity and an improvement in a film quality are desired in the various thermal processes. For example, in a process of a channel layer of a transistor as a semiconductor device, the channel layer is generally subjected to an annealing process with a view to stabilizing an atomic structure, after ion implantation of impurity atoms.

Although the annealing process of the channel layer for a long period of time can stabilize the atomic structure, the long annealing process undesirably causes the impurity atoms to diffuse downward in a film-thickness direction of the channel layer to penetrate the same. Thus, the annealing process should be carried out as briefly as possible. That is, in order to stabilize the atomic structure without penetration of the atoms through the channel layer, while reducing the film-thickness thereof, the semiconductor wafer should be rapidly heated to a high temperature to perform the annealing process, and should be rapidly cooled to a low temperature to prevent diffusion of atoms after completion of the annealing process.

In order that such an annealing process is realized, a conventional thermal processing apparatus is provided, in a lamp house equipped with a heating lamp, with a shutting mechanism for shutting a radiation heat. When a wafer temperature is lowered after the annealing process of a high temperature, the shutting mechanism is so operated as to shut the radiation heat radiated from the heating lamp. Thus, the wafer can be rapidly cooled to a lower temperature.

Another conventional thermal processing apparatus is disclosed in JP2001-85408A in which a Peltier element is disposed on a wafer stage. When a wafer is subjected to an etching process at a temperature of about 100° C. to about 250° C., the Peltier element is utilized to raise or lower the temperature of the wafer.

However, the conventional thermal processing apparatus having the shutting mechanism is disadvantageous in that a bulk of the shutting mechanism enlarges the size of the thermal processing apparatus, and a provision of such bulky shutting mechanism complicates a structure of the thermal processing apparatus. On the other hand, the conventional thermal processing apparatus having the Peltier element is suitable for the etching process using a process temperature as low as 100° C. to 250° C., but the apparatus is insufficient to perform the annealing process of a higher temperature.

DISCLOSURE OF INVENTION

Taking account of the above problems, the present invention has been made to efficiently cope therewith. An objective of the present invention is to provide a thermal processing apparatus capable of rapidly increasing and decreasing a temperature of an object to be processed, when the object is subjected to a thermal process at a high temperature. Another objective of the present invention is to provide a thermal processing apparatus capable of improving a heating efficiency of the object.

In order to achieve the objective, the present invention provides a thermal processing apparatus that conducts a thermal process to an object to be processed at a temperature of 400° C. or more, the thermal processing apparatus comprising:

a processing vessel having a transmitting window in a top part thereof;

a table disposed in the processing vessel, the table supporting thereon the object opposed to the transmitting window;

a plurality of heating lamps disposed on above the processing vessel, the lamps heating the object by irradiating heat rays to the object through the transmitting window; and a thermoelectric converter disposed on the table and configured to at least cool the object.

According to the thermal processing apparatus, when a thermal process for the object is performed at a temperature of 400° C. or more, the object is mainly heated by the heat rays from the heating lamps to raise a temperature of the object, while the object is forcibly cooled by means of the thermoelectric converter to lower the temperature of the object. Thus, the temperature of the object can be rapidly increased and decreased.

In this apparatus, it is preferable that a heat-medium jacket containing a heat-medium flow path is disposed below the thermoelectric converter.

Preferably, the thermoelectric converter is configured to heat the object by applying thereto an electric current in an opposite direction when the object is cooled.

Preferably, the thermoelectric converter includes a plurality of thermoelectric transducers arranged in their respective zones of the table; and the thermal processing apparatus further comprises a transducer controller configured to control electric currents to be applied to the thermoelectric transducers for each zone of the table independently.

This structure allows a rapid lowering of the temperature of the object, while maintaining an intra-surface uniformity in the temperature of the object.

In this case, the transducer controller may intermittently apply the electric currents to the thermoelectric transducers, and measure temperatures of the thermoelectric transducers based on electromotive forces of the thermoelectric transducers while no current is applied thereto.

When the object to be processed is a silicon wafer, it is preferable that the plurality of heating lamps includes an ultraviolet discharge lamp that mainly irradiates an ultraviolet ray and a halogen lamp that mainly irradiates a visible ray.

Due to this structure, an absorptance of the object with respect to the heat rays from the heating lamps is elevated, so that the temperature of the object can be more rapidly raised.

In this case, it is preferable that the electric power of the ultraviolet discharge lamp is duty-controlled.

Preferably, a center portion of the object is mainly irradiated with the ultraviolet ray from the ultraviolet discharge lamp, and a peripheral portion of the object is mainly irradiated with the visible ray from the halogen lamp.

The present invention also provides a thermal processing apparatus that conducts a thermal process to an object to be processed at a high temperature, the thermal processing apparatus comprising:

a processing vessel having a transmitting window in a top part thereof;

a table disposed in the processing vessel, the table supporting thereon the object opposed to the transmitting window; and a plurality of heating lamps disposed above the processing vessel, the lamps heating the object by irradiating heat rays to the object through the transmitting window; wherein the table includes an absorbing plate that mainly absorbs the heat rays of a kind mainly irradiated from the heating lamps.

As stated above, the heating efficiency of the object disposed on the table can be further improved by the absorbing plate that mainly absorb the heat rays of a kind mainly irradiated from the heating lamps.

In this apparatus, the table may include a plurality of absorbing plates that mainly absorb the heat ray of different kinds.

In this case, it is preferable that a thermoelectric converter is disposed between the absorbing plates, the thermoelectric converter being configured to at least cooling a side thereof facing the object.

BEST MODE FOR CARRYING OUT THE INVENTION

Embodiments of a thermal processing apparatus according to the present invention will be described below with reference to the accompanying drawings.

First Embodiment

Figure 1:
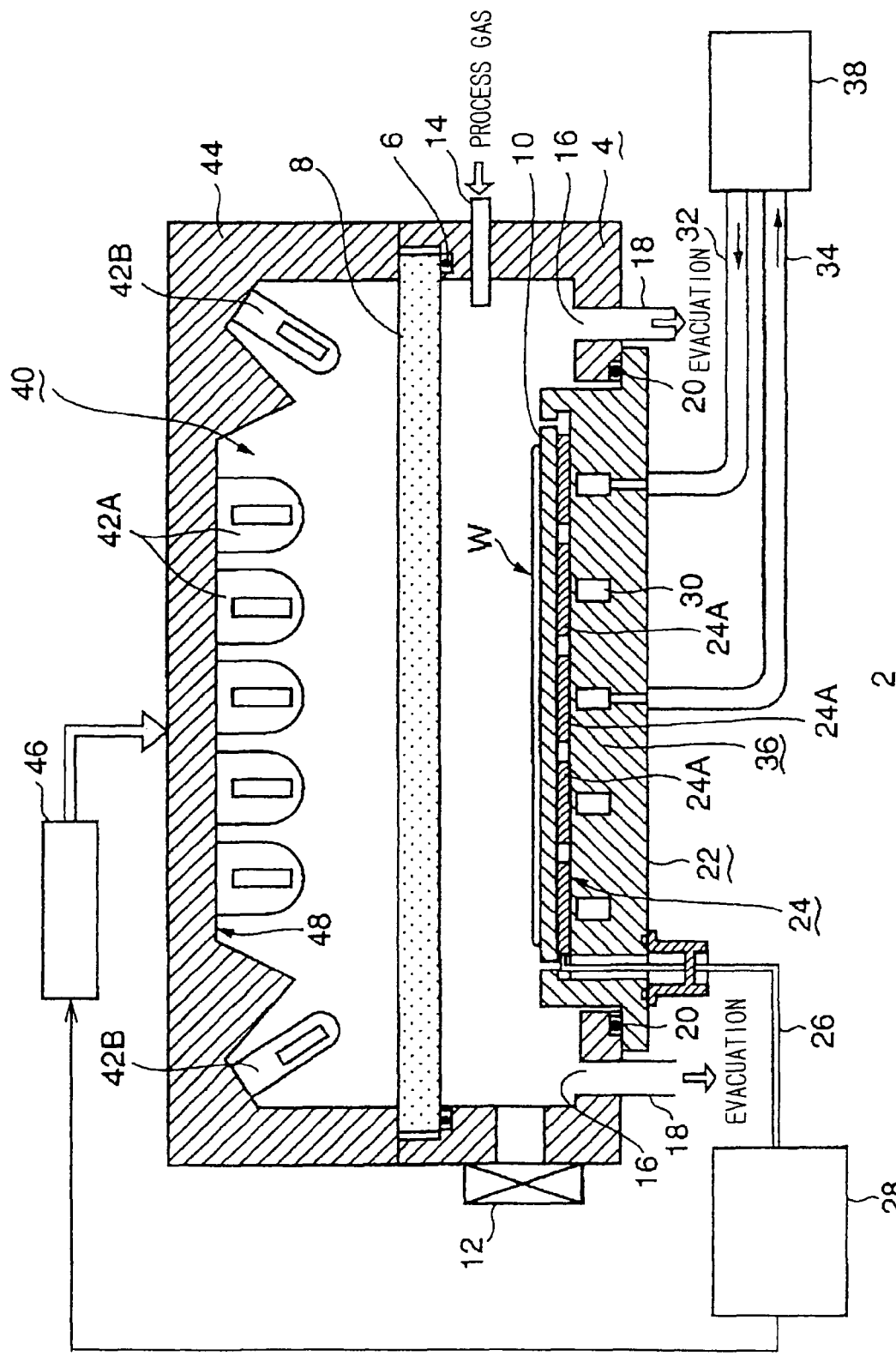
FIG. 1 is a schematic sectional view of a thermal processing apparatus in a first embodiment of the present invention.

As shown in FIG. 1, a thermal processing apparatus 2 in a first embodiment of the present invention includes a cylindrical processing vessel 4 made of, e.g., aluminum. A top part of the processing vessel 4 is opened, and a transparent transmitting window 8 is air-tightly fitted in the top opening through a sealing member 6 such as an O-ring. A thin disk-shaped table 10 is disposed in the processing vessel 4. An object to be processed such as a semiconductor wafer W is supported on an upper surface of the table 10. The table 10 is formed of such a material that is best suited for absorbing a light ray irradiated from a heat lamp to be used. For example, the table 10 is formed of an $SiO_2$ material, an AlN material, or an SiC material, which tends to mainly absorb a light ray from an infrared lamp. Alternatively, the table 10 is formed of a Ge (germanium) material, an Si material, or a metal material, which tends to mainly absorb a light ray from an ultraviolet lamp or a halogen lamp.

A gate valve 12 is disposed in a sidewall of the processing vessel 4 which is opened/closed when the semiconductor wafer W is loaded into the processing vessel 4 and/or unloaded therefrom. A gas nozzle 14 for supplying a process gas required for a thermal process into the processing vessel 4 is disposed in the sidewall of the same. An outlet port 16 is formed at a peripheral portion of a bottom surface of the processing vessel 4. An exhaust system 18 provided with a vacuum pump, not shown, is connected to the outlet port 16, so that an inside of the processing vessel 4 can be evacuated to create therein a vacuum. In a center portion of the bottom surface of the processing vessel 4, that is, inside the peripheral portion of the bottom surface, there is formed an opening of a large diameter in which a thick bottom plate 22 made of, e.g., aluminum is air-tightly fitted through a sealing member 20 such as an O-ring.

The disk-shaped table 10 is joined to an upper surface of the bottom plate 22 through a thermoelectric converter 24. The thermoelectric converter 24 includes, for example, a plurality of Peltier elements 24A as thermoelectric transducers. The Peltier elements 24A are connected to a Peltier controller (transducer controller) 28 through lead wires 26 extending from the Peltier elements 24A to air-tightly pass outward through the bottom plate 22. The Peltier controller 28 controls a direction and an intensity of an electric current. A thermoelectric converter converts a thermal energy to an electric energy, and vice versa. The Peltier element 24A may be a device capable of withstanding use under a high temperature of, e.g., 400° C. or more. For example, a $Bi_2Te_3$ (bismuth tellurium) device, a PbTe (plumbum tellurium) device, and an SiGe (silicon germanium) device can be used as the Peltier element 24A.

A heat-medium flow path 30 through which a heat medium flows is formed in an upper part of the bottom plate 22 to extend thereover in a planar direction. A heat-medium supply path 32 is connected to one end of the heat-medium flow path 30, while a heat-medium discharge path 34 is connected to the other end of the heat-medium flow path 30. Namely, the bottom plate 22 also serves as a heat-medium jacket 36. It is possible to cause at least a coolant to flow as a heat medium. The coolant draws a heat from lower surfaces of the Peltier elements 24A to cool the same. Alternatively, a hot heat medium can be caused to flow to draw a cold heat from the lower surfaces of the Peltier elements 24A to heat the same. The heat medium is circulated by a circulator 38, for example. The bottom plate 22 is provided with a lifter pin, not shown, for vertically moving the wafer W relative to the table 10.

Heating means 40 for heating the wafer W is disposed above the transmitting window 8. To be specific, the heating means 40 is composed of a plurality of heating lamps 42A and 42B which are spread out on a lower surface of a ceiling of a box-like lamp house 44 disposed above the transmitting window 8. An inner surface of the ceiling of the lamp house 44 provides a reflecting mirror 48 that reflects downward heat rays emitted from the heating lamps 42A and 42B. A total electric power of the heating lamps 42A and 42B is about 100 kW to about 200 kW. The heating lamps 42A and 42B are controlled by a lamp controller 46 to which temperature information, for example, is inputted from the Peltier controller 28, which will be described hereinafter.

In the illustrated example, the heating lamps 42A positioned on a portion other than a peripheral portion of the lamp house 44, i.e., a center portion thereof, are disposed in such a manner that irradiation directions of heat rays from the lamps 42A are oriented directly downward. Meanwhile, the heating lamps 42B positioned on the peripheral portion of the lamp house 44 are diagonally disposed to be oriented downwardly inward. Thus, the irradiation directions of heat rays from the lamps 42B are focused on a peripheral portion of the wafer W. The term "heat ray" includes an ultraviolet ray, a visible ray, and an infrared ray (including a near infrared ray and a far infrared ray).

Figure 2:
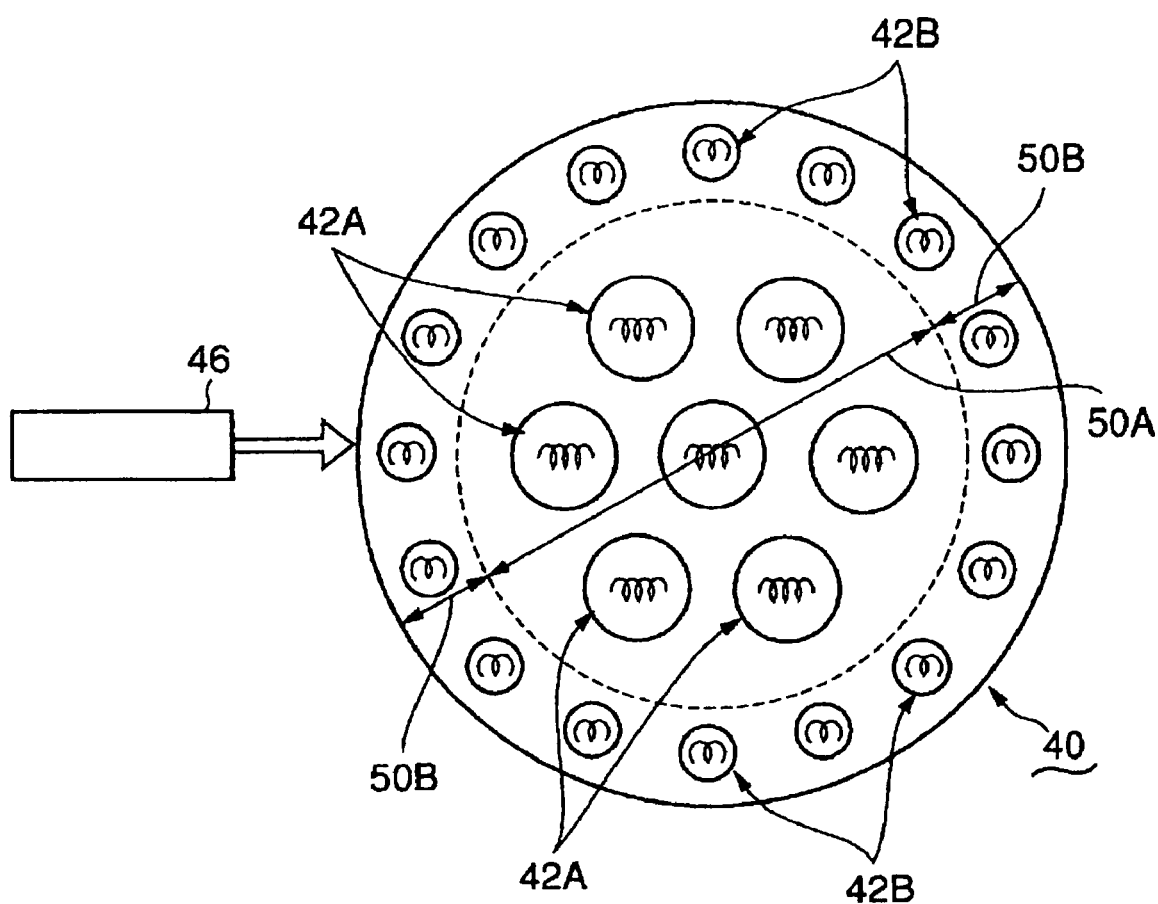
FIG. 2 is a plan view of an arrangement example of heating lamps of heating means.

As shown in FIG. 2, the ceiling of the lamp house 44 on which the heating lamps 42A and 42B are attached is concentrically divided into a central inside zone 50A and a peripheral outside zone 50B. A group of heating lamps 42A is disposed in the inside zone 50A and a group of heating lamps 42B is disposed in the outside zone 50B. Electric power of heating lamps 42A and 42B can be controlled for each of the zones 50A and 50B independently. In order that a plane of the wafer can be uniformly heated, it is preferable that the heating lamps 42A in the inside zone 50A be arranged in a relatively widely spaced out manner, while the heating lamps 42B in the outside zone 50B be arranged in a relatively narrowly spaced manner.

The heating lamps 42A and 42B may be one or more kinds of lamps selected from the group consisting of an ultraviolet radiation lamp that mainly emits the ultraviolet ray, a halogen lamp that mainly emits the visible ray, and an infrared radiation lamp that mainly emits an infrared ray. As illustrated in FIG. 1, the central heating lamps 42A are, for example, large-sized ultraviolet discharge lamps capable of outputting high power. Meanwhile, the peripheral heating lamps 42B are, for example, small-sized halogen lamps. A material (body material) and a coating material of the transmitting window 8 are determined such that an absorptance of the window 8 with respect to the light rays emitted from the heating lamps 42A and 42B is low. Specifically, there are used, for example, a fused quartz glass, heat-resistant glass, a $CaF_2$ (calcium fluoride) material, an LiF (lithium fluoride) material, a Ge (germanium) material, and a coated Ge body (base) material.

Figure 3:
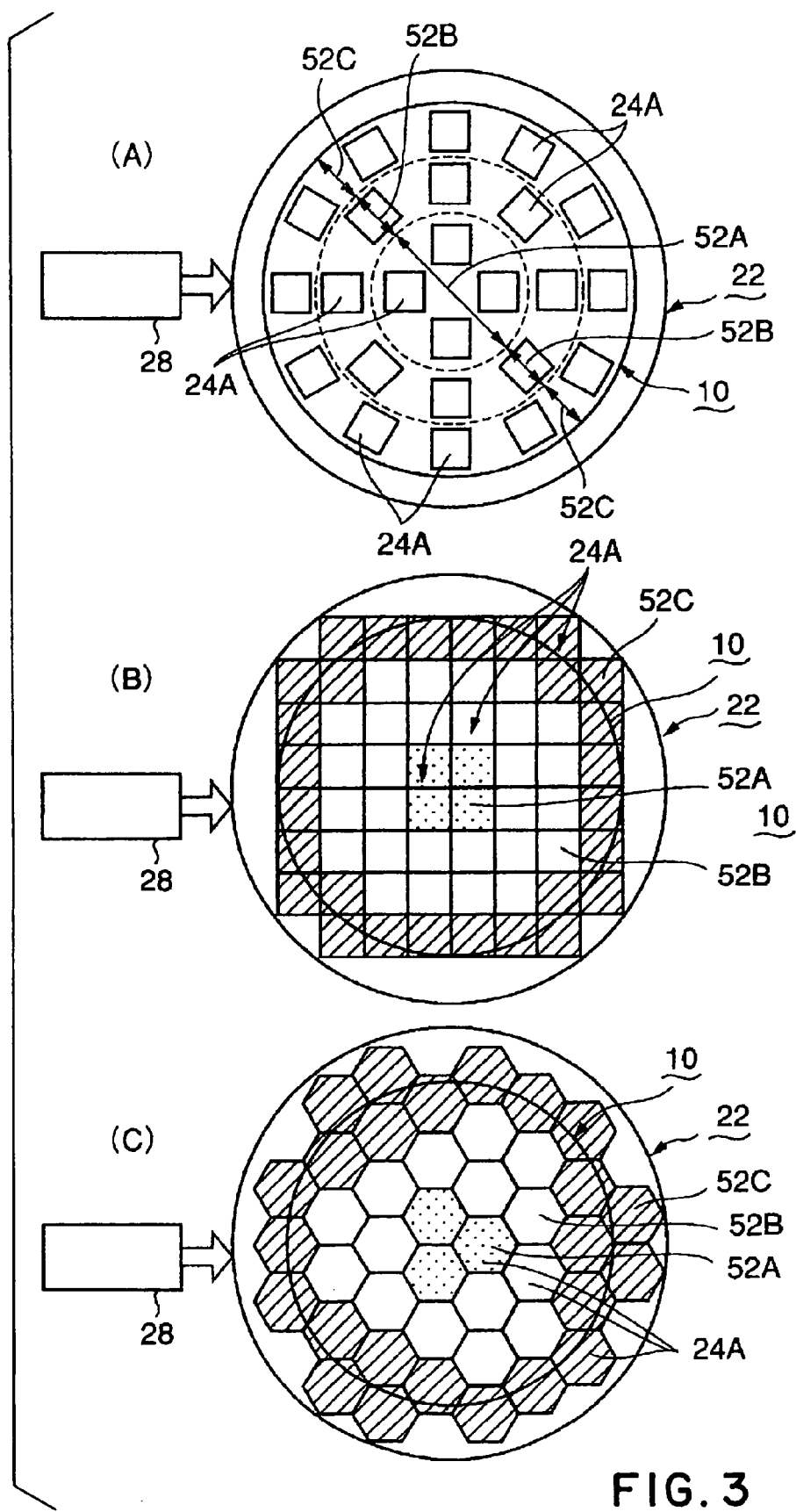
FIG. 3 shows plan views (A) to (C) of arrangement examples of Peltier elements in a thermoelectric converter.

As shown in FIG. 3(A), the Peltier elements 24A on the base plate 22 are arranged on substantially the whole surface of the table 10. The Peltier elements 24A are arranged on the table 10 which is concentrically divided into a central inside zone 52A, a middle zone 52B surrounding the inside zone 52A, and a peripheral outside zone 52C surrounding the middle zone 52B. The outside zone 52C a temperature of which should be delicately controlled is further circumferentially divided into four zones each including three Peltier elements 24A. The zones 52A, 52B, and 52C (the four divided zones of the outside zone 52C) can be independently controlled.

Instead of the arrangement of the Peltier elements 24A shown in FIG. 3(A), the Peltier elements 24A can be arranged as shown in FIG. 3(B) and FIG. 3(C). In these examples, the Peltier elements 24A are laid substantially all over the table 10, with little gaps being remained between the Peltier elements 24A. Due to this structure, a more precise and uniform temperature control can be achieved. In these arrangements, although the zones 52A, 52B, and 52C are not concentric with each other in a strict sense, the zones 52A, 52B, and 52C can be suitably determined as shown in FIG. 3(B) and FIG. 3(C). The Peltier element 24A shown in FIG. 3(A) and FIG. 3(B) has substantially a rectangular shape, while the Peltier element 24A shown in FIG. 3(C) has substantially a hexagonal shape. In FIG. 3(B) and FIG. 3(C), the Peltier elements 24A in the respective zones have different patterns, so as to clearly show the separated zones. Note that the dividing manner of the zones shown in FIG. 3(A) to (C) is merely an example, and it goes without saying that the present invention is not limited thereto.

Next, an operation of the thermal processing apparatus 2 as constituted above is explained below. First, the unprocessed semiconductor W is carried into the processing vessel 4 through the gate valve 12 which has been opened for the annealing process, and the wafer W is supported on the table 10. Then, the processing vessel 4 is hermetically closed. Thereafter, a process gas such as $N_2$ gas or Ar gas is supplied into the processing vessel 4 through the gas nozzle 14, with its flow rate being controlled, while an interior of the processing vessel 4 is evacuated and vacuumed to maintain a predetermined process pressure of, e.g., 1 Pa to 100 Pa (7.5 mTorr-750 mTorr). At the same time, the heating means 40 is operated by the lamp controller 46 to light the heating lamps 42A and 42B.

Then, heat rays emitted from the heating lamps 42A and 42B transmit the transmitting window 8 to enter the surface of the semiconductor wafer W, so that the wafer w is heated and the temperature thereof is rapidly increased. The temperature elevation speed is, for example, about 100° C./sec to about 200° C./sec. In the case where ultraviolet discharge lamps are used as the heating lamps, the ultraviolet discharge lamps are duty-controlled to control the electric power to be supplied thereto. This manner also applies to the respective embodiments described hereinbelow. Then, the wafer W is subjected to the annealing process, while it is maintained at a process temperature of 400° C. or more, e.g., 500° C. to 1000° C. for a predetermined period. The reason for duty-controlling the ultraviolet discharge lamp is as follows. That is, when the electric power continues to be supplied to the ultraviolet discharge lamp, with gradually increasing the power, discharge does not occur until the electric power takes a certain value (threshold value). Namely, a heat ray amount cannot be gradually increased in proportion to the supplied electric power, and thus the heat ray amount cannot continuously change from 0% to 100%. However, when the duty control based on varying duty ratio is carried out by the sufficient electric power to occur discharge, these problems can be solved at once.

Upon completion of the annealing process, the temperature of the wafer W is rapidly lowered. In order thereto, the heating lamps 42A and 42B are turned off, and an electric current is caused to flow through the Peltier elements 24A in the thermoelectric converter 24 disposed on the lower surface of the table 10 in such a direction that upper surfaces of the Peltier elements 24A are cooled. In addition to the cooling effect produced by convection in the processing vessel 4 and radiation, a cold (negative) heat energy generated on the upper surfaces of the Peltier elements 24A cools the same. Thus, the table 10 in contact with the Peltier elements 24A is cooled to rapidly cool the wafer W, i.e., the temperature of the wafer W can be rapidly decreased. At this time, the lower surfaces of the Peltier elements 24A become hot by a hot (positive) heat energy generated thereon, a heat medium for cooling is caused to flow through the heat-medium flow path 30 of the heat-medium jacket 36 formed in the base plate 22. Thus, the heat energy generated on the lower surfaces of the Peltier elements 24A is taken outside the system by the heat medium so as to cool the lower surfaces of the Peltier elements 24A. The heat medium for cooling may be a cooled water, for example.

In this operation, as shown in FIG. 2, the heating lamps 42A and 42B are arranged in the plurality of zones, i.e., two zones in this illustration. The heating lamps 42B in the outside zone 50B are directed to the peripheral portion of the wafer W in which the temperature thereof is difficult to raise, so that the peripheral portion is intensively irradiated with the heat rays. Thus, the temperature of the wafer W can be rapidly raised, while maintaining an intra-surface (in-plane) uniformity in the wafer temperature. The wafer temperature or the temperature of the table 10 can be measured (as temperatures of the Peltier elements 24A themselves) by the Peltier controller 28 based on an electromotive force caused by the Seebeck effect of the respective Peltier elements 24A. The measured temperature result is inputted into the lamp controller 46, and the controller 46 controls the heating lamps 42A and 42B for each zone based on the inputted measurement result. As a result, the temperature of the wafer W can be rapidly increased, while maintaining the intra-surface uniformity in the wafer temperature.

While the temperature of the wafer W is raised, the electric current is caused to flow through the Peltier elements 24A in such a direction that the upper surfaces of the Peltier elements 24A generate heat (the direction of the current is opposite to the direction when the temperature of the wafer W is lowered), so that the wafer W is additionally heated by the Peltier elements 24A. Consequently, the temperature elevation speed of the wafer W can be further accelerated. In this case, the electric current for heating is intermittently applied to the Peltier elements 24A, and the temperatures of the Peltier elements 24A are measured based on the electromotive forces of the Peltier elements 24A while no current is applied thereto. Then, the electric current for heating to be applied to the Peltier elements 24A is controlled for each zone. In this manner, it is possible to maintain a higher intra-surface uniformity in the wafer temperature, during the temperature-elevation operation of the wafer W. When the temperature of the wafer W is increased, a cooled temperature is generated on the lower surfaces of the Peltier elements 24A. Thus, contrary to the case where the temperature of the wafer W is decreased, a heat medium for heating is caused to flow through the heat-medium flow path 30 of the heat medium jacket 36. Therefore, the cooled temperature generated on the lower surfaces of the Peltier elements 24A is taken outside the system. The heat medium for heating may be a hot water, for example.

When the temperature of the wafer W is lowered, the electric current for cooling the wafer is intermittently applied to the Peltier elements 24A, and the temperatures of Peltier elements 24A are measured based on the electromotive forces of the Peltier elements 24A while no current is applied thereto. Then, the electric current for cooling to be applied to the Peltier elements 24A is controlled for each zone. In this manner, it is possible to lower the temperature of the wafer W, while maintaining a higher intra-surface uniformity in the wafer temperature. By increasing the number of divided zones for the Peltier elements 24A, or controlling the electric currents for each Peltier element 24A, it is possible to maintain a more improved intra-surface uniformity in the wafer temperature when the temperature of the wafer W is raised or lowered. Naturally, the temperature of the table can be measured by means of a thermocouple buried in the table, or a radiation thermometer that measures the temperature through optic fibers based on a radiation amount of heat.

Figure 4:
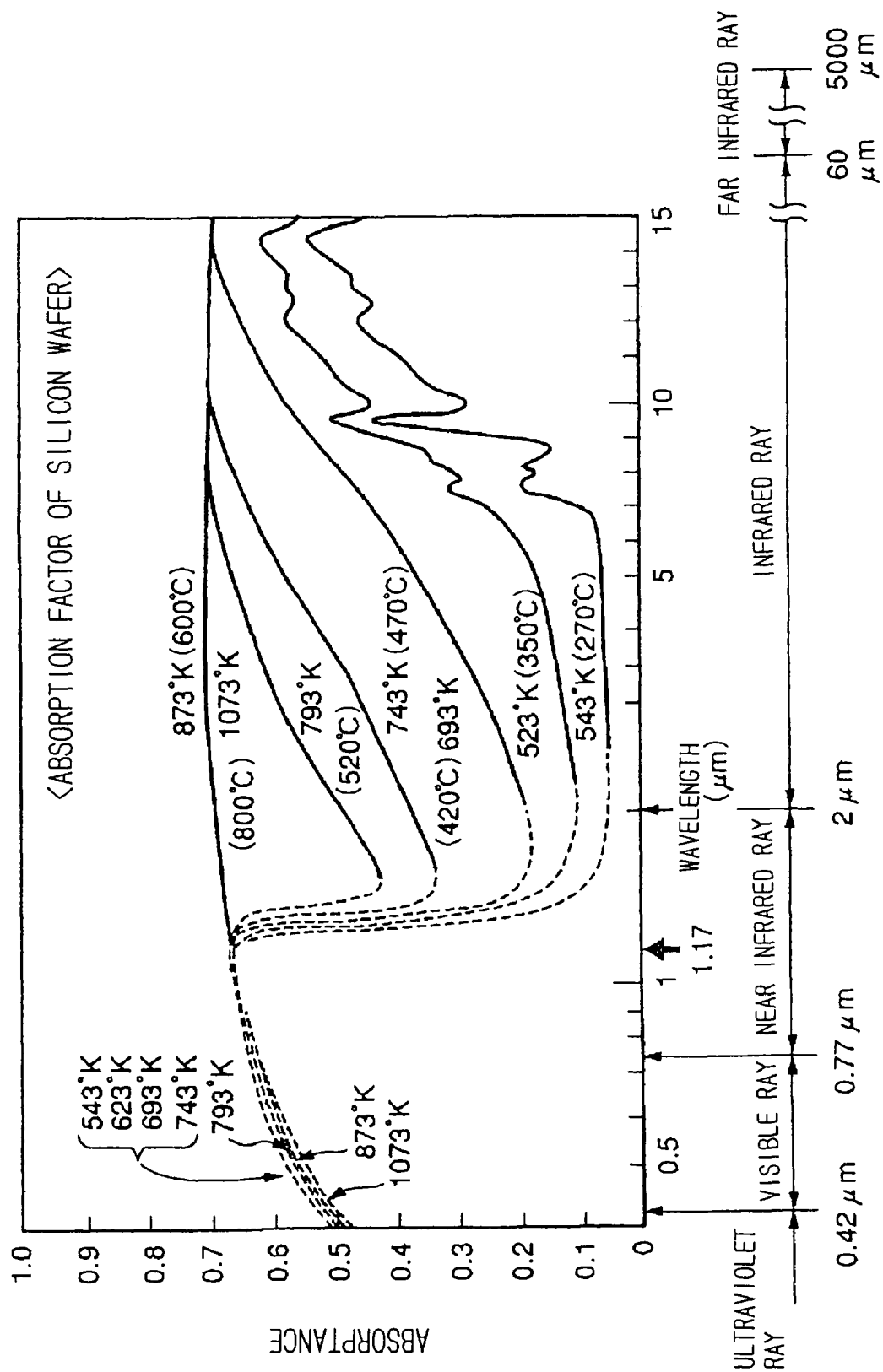
FIG. 4 is a graph of absorptances of a silicon wafer with respect to a wavelength of a heat ray.

In order to rapidly raise the temperature of the object, it is not sufficient to increase the electric power to be supplied to the heating lamps of the heating means 40. In addition thereto, an absorptance of the object itself should be increased with respect to the heating rays from the lamps. A case in which a silicon wafer is used as an object to be processed is examined, for example. FIG. 4 shows absorptances of the silicon wafer with respect to the heat ray. As understood from FIG. 4, the absorptance of the silicon wafer with respect to the heat ray depends on a wavelength of the heat ray and a temperature of the silicon wafer. The term "heat ray" used herein is a general concept including the ultraviolet ray to the far-infrared ray, as stated above.

As shown in FIG. 4, when the wavelength is about 1.17 μm or smaller, the silicon wafer exhibits the high absorptances of about 0.5 to about 0.7, irrespective of the temperatures of the wafer. On the other hand, when the wavelength is larger than 1.17 μm, the absorptance depends largely on the temperature of the wafer, i.e., the lower the temperature becomes, the smaller the absorptance becomes (the larger the transmittance becomes). That is, when the temperature of the silicon wafer is changed in a range of from 270° C. to 600° C., the absorptance is changed in a range of from 0.1 to 0.7 in accordance with the temperature change.

Accordingly, it can be found that, in order to rapidly increase the temperature of the object, it is preferable to use a lamp which outputs the heat ray having a wavelength of 1.17 μm or less, i.e., an ultraviolet discharge lamp that mainly emits the ultraviolet ray, and a halogen lamp that mainly emits the visible ray. Use of the lamp of this type can enhance a heating efficiency because of an effective use of the heat ray.

In order to improve the heating efficiency, it is very important to which degree the heat ray transmitting the silicon wafer is absorbed by the table 10 disposed therebelow. Thus, a material of the table 10 is examined below.

Figure 5:
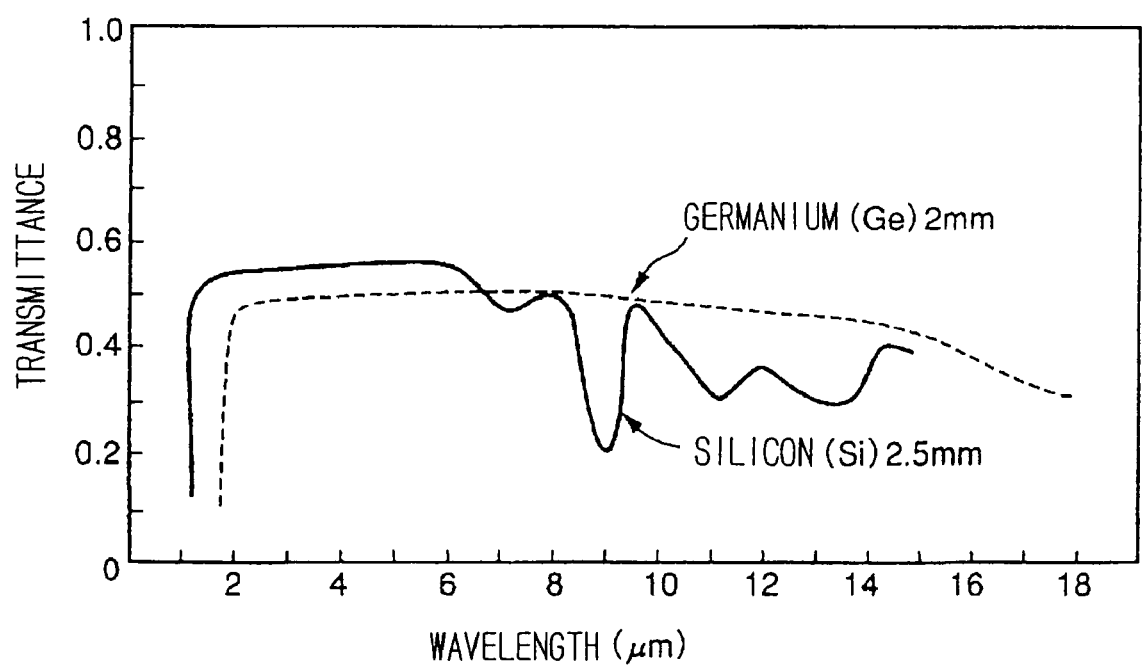
FIG. 5 is a graph of transmittances of germanium and silicon with respect to a wavelength of a heat ray.

FIG. 5 is a graph showing transmittances (substantially equal to 1 minus absorptance) of germanium and silicon with respect to a wavelength of the heat ray, and FIG. 6(A) to (C) are graphs showing absorptances of quartz ($SiO_2$), aluminum nitride (AlN), and silicon carbide (SiC), respectively, with respect to a wavelength of the heat ray. In FIG. 5, a thickness of the germanium substrate is set at 2 mm, and a thickness of the silicon substrate is set at 2.5 mm. As clearly shown in FIG. 5, in a visible-ray area and an ultraviolet area, in which a wavelength of the heat ray is 0.77 μm or less, the transmittances of the germanium substrate and the silicon substrate are not more than 10%, i.e., the absorptances thereof are as large as 90% or more. Thus, it was confirmed that, when an ultraviolet discharge lamp, a halogen lamp, or a combination thereof as in this embodiment is used as a heating lamp, the germanium substrate and the silicon substrate are preferably used as a material of the table 10. The table 10 made of germanium or silicon can effectively absorb the heat ray that has transmitted the silicon wafer, and hence the silicon wafer can be heated by the heat of the table 10. As a result, the heating efficiency can be improved by the heat of the table 10, and the temperature elevation speed can be further accelerated.

In FIG. 6(A) to (C), thicknesses of the $SiO_2$ plate (FIG. 6(A)), the AlN plate (FIG. 6(B)), and the SiC plate (FIG. 6(C)) are set in a range of from 1.3 mm to 3.4 mm. These plates do not exhibit sufficiently high absorptances in the infrared area in which the wavelength is 4 μm or less, and exhibit very low absorptances in the ultraviolet area and the visible-ray area. Thus, it was confirmed that, when an infrared lamp is used as a heating lamp, the table 10 is preferably made of an $SiO_2$ plate, an AlN plate, or an SiC plate. In this case, a ceramic material including another oxide instead of SiC may be used.

In order to improve the heating efficiency, a transmittance of the transmitting window 8 with respect to the heat ray is very important. Thus, a material of the transmitting window 8 is examined below.

Figure 7:
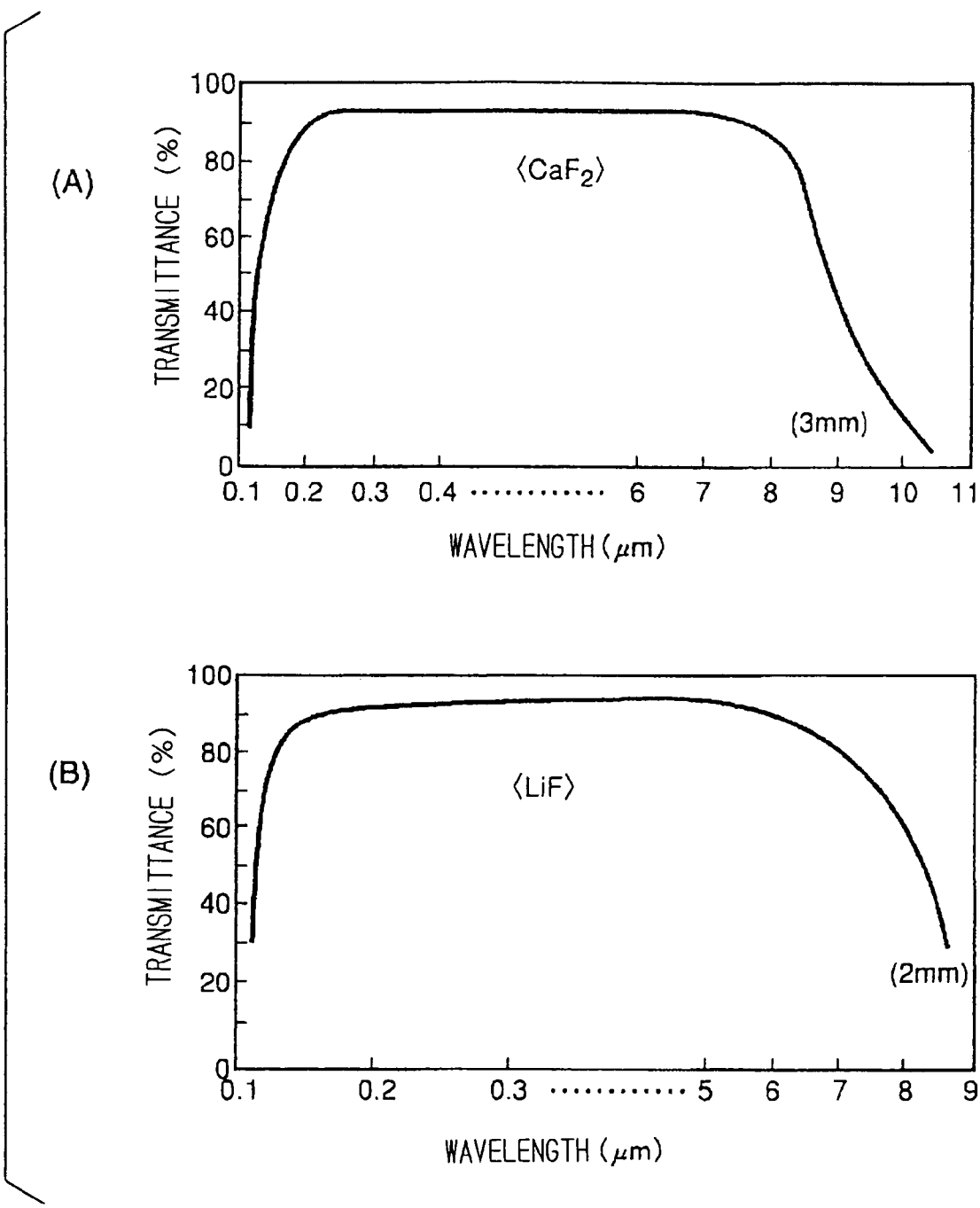
FIG. 7 shows graphs (A) and (B) each showing a transmittance of $CaF_2$ (calcium fluoride) and LiF (lithium fluoride) with respect to a wavelength of a heat ray.
Figure 8:
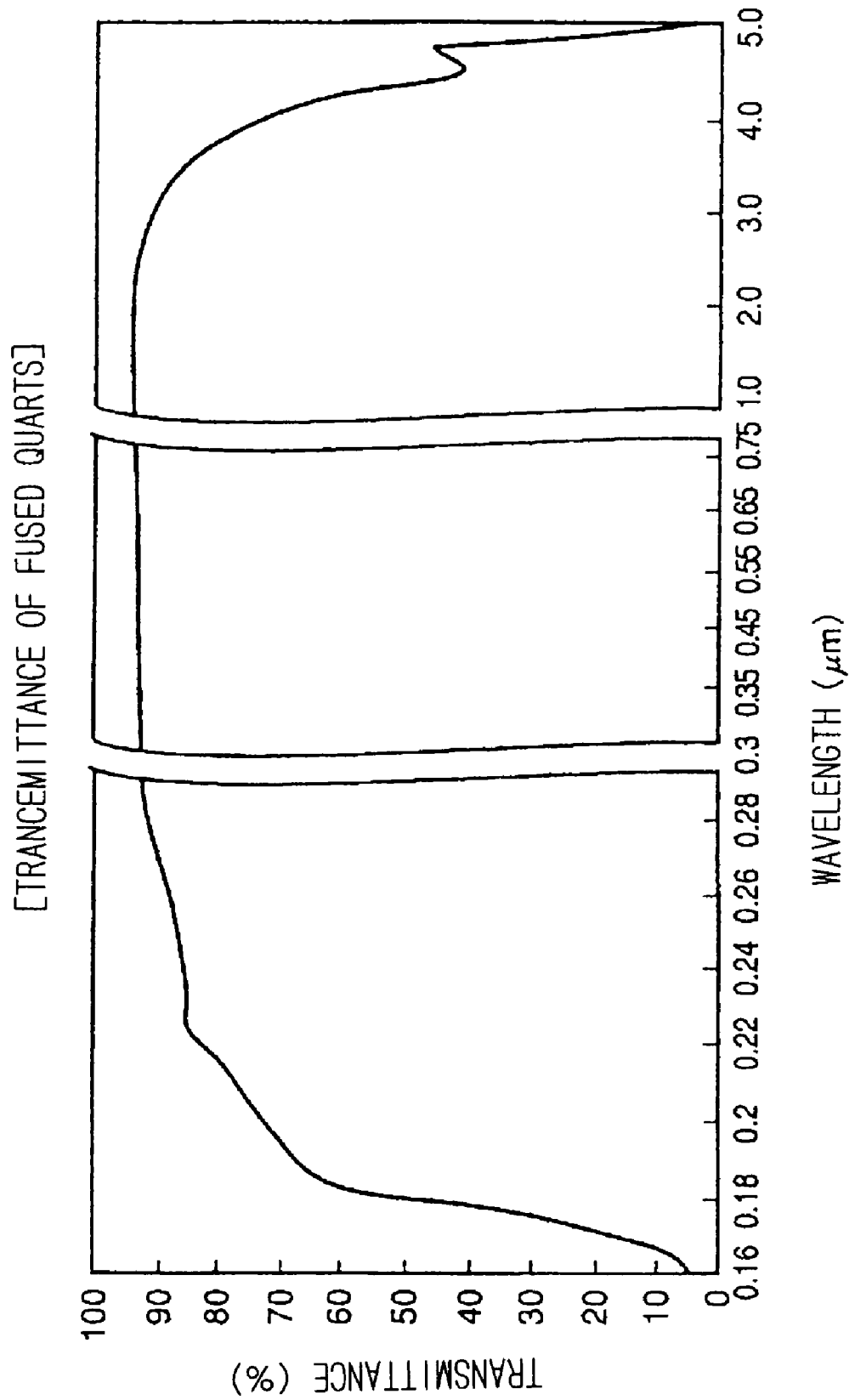
FIG. 8 is a graph showing a transmittance of fused quartz with respect to a wavelength of a heat ray.
Figure 9:
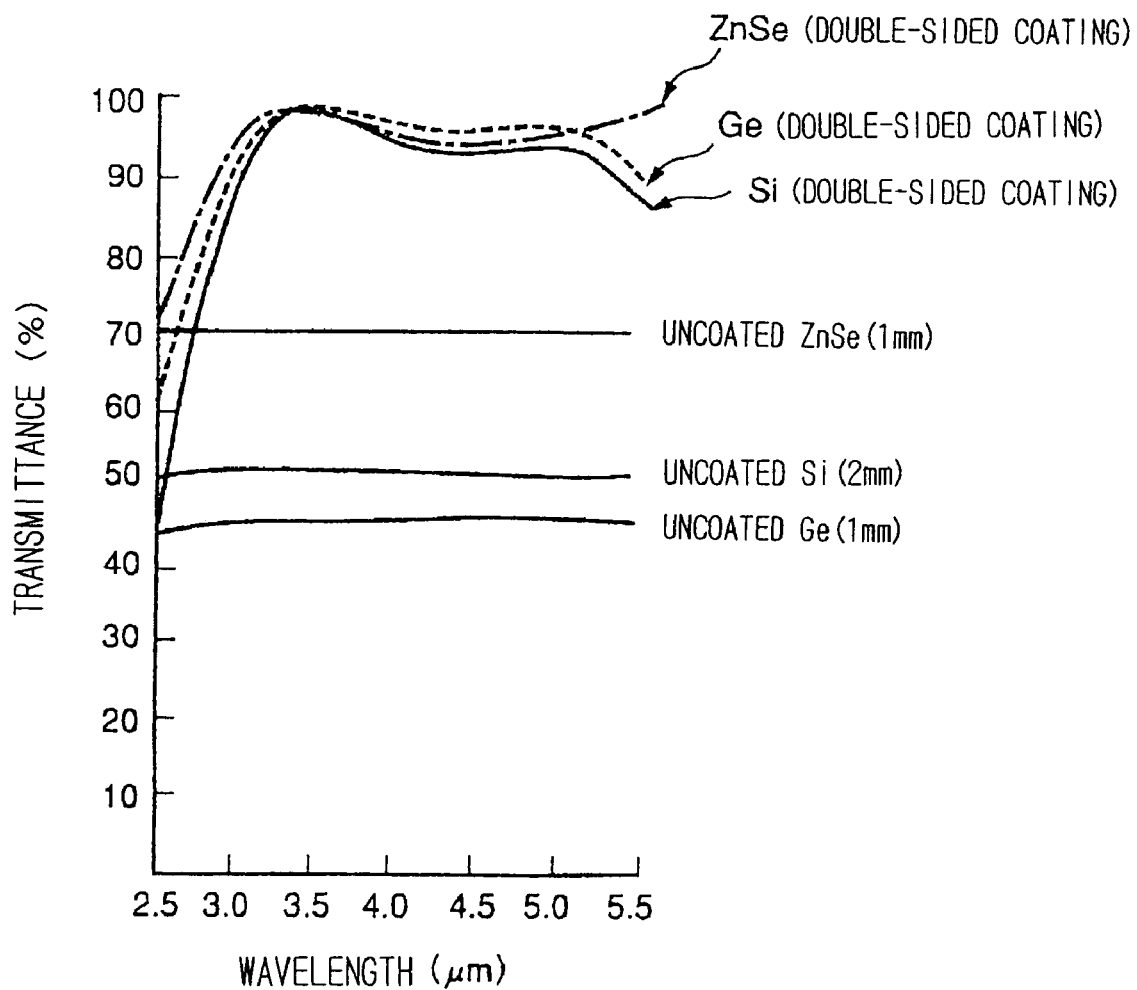
FIG. 9 is a graph showing transmittances of various uncoated row materials and coated row materials in an infrared area.

FIG. 7(A) and FIG. 7(B) are graphs showing transmittances of a $CaF_2$ (calcium fluoride) plate with a thickness of 3 mm, and an LiF (lithium fluoride) plate with a thickness of 2 mm, respectively, with respect to a wavelength of the heat ray. FIG. 8 is a graph showing a transmittance of a fused quartz plate with a thickness of 1 mm with respect to a wavelength of the heat ray. FIG. 9 is a graph showing transmittances of coated plates of various body materials in the infrared area.

As shown in FIG. 7(A), the $CaF_2$ plate exhibits a transmittance as high as about 90% in a range from the ultraviolet ray having a wavelength of 0.2 μm to the infrared ray having a wavelength of 8 μm. As shown in FIG. 7(B), the LiF plate exhibits a transmittance as high as about 90% in a range of from the ultraviolet ray having a wavelength of 0.12 μm to the infrared ray having a wavelength of 7 μm. Thus, it was confirmed that the $CaF_2$ plate and the LiF plate can be used as the transmitting window 8 irrespective of the kind of the heating lamp. That is, these plates are compatible with an ultraviolet discharge lamp, a halogen lamp, and an infrared lamp. To be specific, the $CaF_2$ plate and the LiF plate both exhibit a high transmittance in the ultraviolet area. Thus, it was confirmed that these plates are particularly effective when an ultraviolet discharge lamp is used as a hating lamp.

As shown in FIG. 8, the fused quartz plate exhibits a transmittance of as high as 80% from the area of the ultraviolet ray having a wavelength of about 0.2 μm to the area of the infrared light having a wavelength of about 4.0 μm. Thus, it was confirmed that the fused quartz exhibiting a satisfactory transmittance in a wide range from the ultraviolet area to the infrared area is preferred as a material of the transmitting window 8. It was confirmed that the fused quartz shows a particularly high transmittance of 90% or more in the visible-ray area (0.42 μm to 0.77 μm), and thus the fused quartz is especially adapted to the visible ray. Also in this case, the heating efficiency can be enhanced, as well as the temperature elevation speed can be accelerated.

Next, a light ray in the infrared area is examined with reference to FIG. 9. As shown in FIG. 9, a simple (uncoated) ZnSe plate, a simple Si plate, and a simple Ge plate exhibit transmittances of 70%, 50%, and 45%, respectively, which are not so high. On the other hand, when both surfaces of the respective plates are coated as described below, the transmittances of the plates with double-sided coating are significantly increased to reach a range of from 90% to 100%, and thus it was confirmed that the high heating efficiency can be provided. That is, it was confirmed that, when an infrared light is used as a heating lamp, a double-coated ZnSe plate, a double-coated Ge plate, and a double-coated Si plate are preferred.

In the case of the ZnSe plate, an upper surface, i.e., a heat ray incident surface of the ZnSe plate was coated with a $ThF_4$ coating material whose refractive index is lower than that of the ZnSe as the body material, while a lower surface, i.e., a heat ray transmitting surface was coated with a ZeSe coating material whose refractive index is higher than that of the ZnSe as the body material. In the case of the Si plate, an upper surface thereof was coated with an $SiO_2$ coating material whose refractive index is lower than that of Si as the body material, while a lower surface thereof is coated with a Ge coating material whose refractive index is higher than that of Si as the body material. In the case of the Ge plate, an upper surface thereof was coated with the $SiO_2$ coating material whose refractive index is lower than that of Ge as the body material, while a lower surface thereof was coated with the Ge coating material whose refractive index is higher than Ge as the body material.

Second Embodiment

In the first embodiment, the table 10 is formed of a single material, but the present invention is not limited thereto. For example, the table 10 may be formed by stacking a plurality of absorbing plates having different main absorption wavelength bands.

Figure 10:
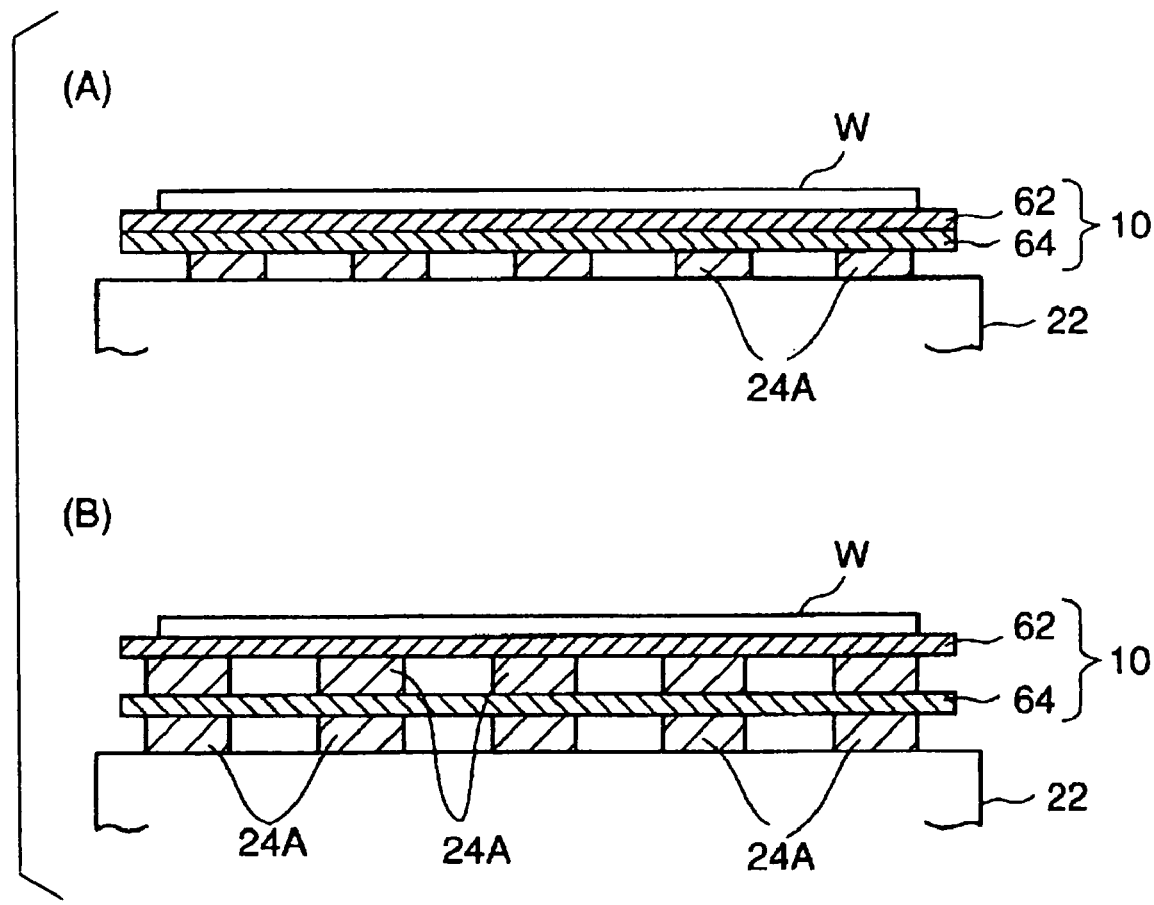
FIG. 10 shows schematic views (A) and (B) of structures of a table of a thermal processing apparatus in a second embodiment of the present invention.

FIG. 10 shows schematic views (A) and (B) of structures of a table in a second embodiment of the present invention. Illustration of structures other than the table 10 are omitted. Specifically, the table 10 is manufactured by stacking a visible-ray absorbing plate 62 that mainly absorbs the ultraviolet ray and the visible ray, and an infrared-ray absorbing plate 64 that mainly absorbs the infrared ray.

Figure 6:
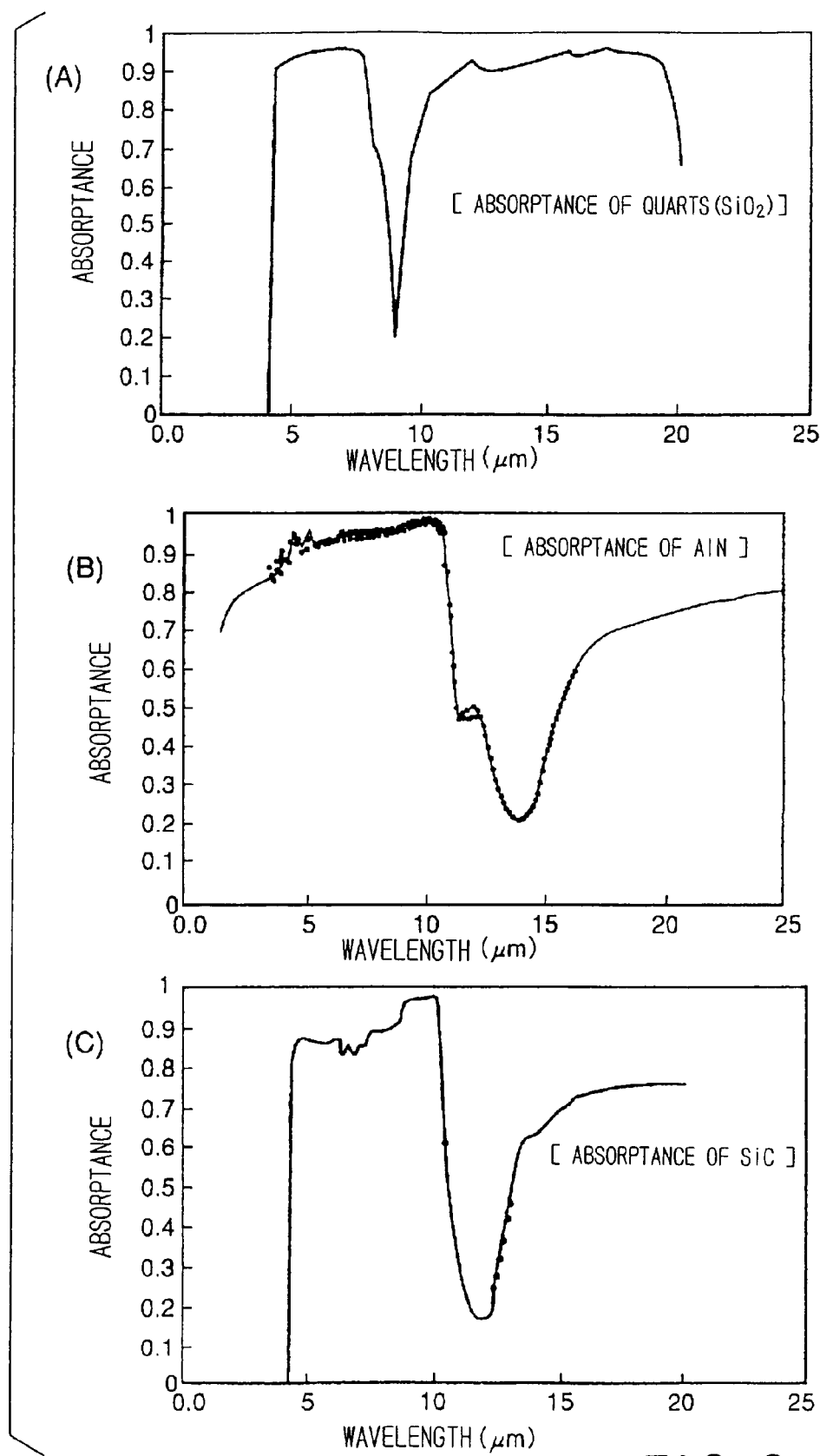
FIG. 6 shows graphs (A) to (C) each showing an absorptance of quartz, aluminum nitride (AlN), and SiC with respect to a wavelength of a heat ray.

Regarding materials constituting the respective absorbing plates 62 and 64, the ultraviolet and visible-ray absorbing plate 62 may be a germanium plate or a silicon plate, for example, while the infrared-light absorbing plate 64 may be a quartz plate, an AlN plate, or an SiC plate, which has been as stated above referring to FIGS. 5 and 6. The term "infrared light" herein includes the near infrared ray, the infrared ray, and the far infrared ray. Due to this constitution, the table 10 can absorb all the heat ray transmitting an object to be processed, the heat ray being of the absorption wavelength band suited for the absorbing plate. Therefore, by means of the heat ray absorbed by the table 10, the heating efficiency can be significantly enhanced, and the temperature elevation speed can be further accelerated.

In FIG. 10(A), the staking order of the absorbing plates 62 and 64 are not specifically limited. In addition, it is possible to stack three absorbing plates each having a high absorptance with respect to a light ray of different wavelength bands.

In the structure shown in FIG. 10(A), the two absorbing plates 62 and 64 are stacked to each other to form the table 10, and Peltier elements 24A are bonded to a lower surface of the table 10. Alternatively, as shown in FIG. 10(B), the Peltier elements 24A may be intervened between the absorbing plates 62 and 64. In this structure, when a wafer temperature is rapidly lowered after an annealing process, electric currents are applied to the Peltier elements 24A such that upper surfaces of the Peltier elements 24A absorb heat (generate cold (negative) heat energy) and lower surfaces of the Peltier elements 24A release heat (generate heat). At this moment, a heat medium for cooling, such as a cooled water, is naturally caused to flow through the heat-medium jacket 36 (FIG. 1).

On the other hand, when the wafer temperature is rapidly increased, the electric currents are applied to the Peltier elements 24A such that the upper surfaces of the Peltier elements 24A release heat (generate heat) and the lower surfaces of the Peltier elements 24A absorb heat (generate cold (negative) heat energy). At this moment, a heat medium for heating is naturally caused to flow through the heat-medium jacket 36 (FIG. 1). The constitution shown in FIG. 10(B) can be applied to the table including three absorbing plates. Such a constitution can enhance a heat conductivity between the absorbing plates 62 and 64 having different absorption wavelength bands of a heat ray. As a result, the heating efficiency and cooling efficiency of the wafer can be improved.

Third Embodiment

Figure 11:
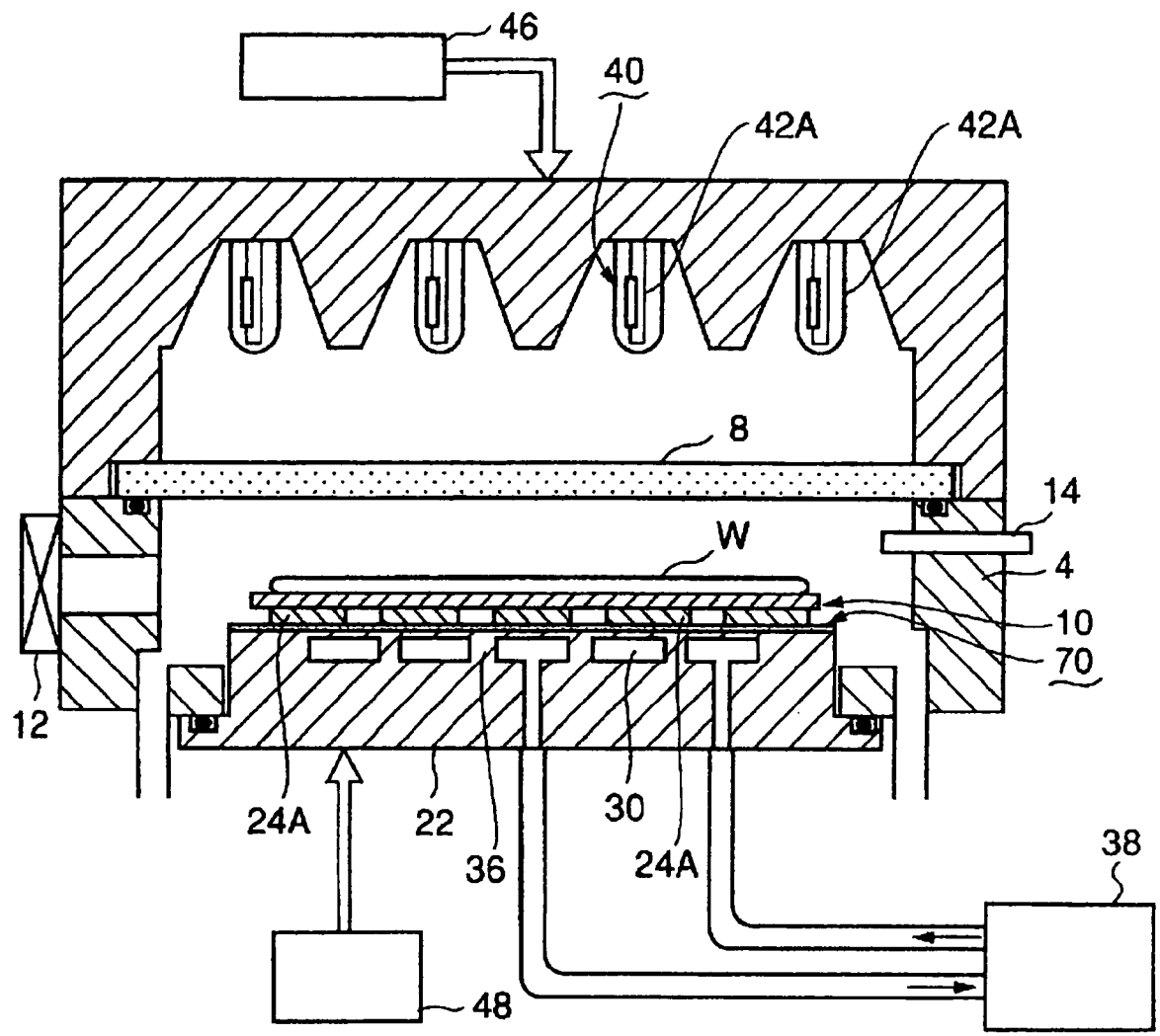
FIG. 11 is a schematic sectional view of a thermal processing apparatus in a third embodiment of the present invention.

Next, a third embodiment of the present invention is described below. FIG. 11 is a schematic sectional view of the third embodiment of the present invention. The same parts as those of FIG. 1 are depicted by the same reference numbers, and their description is omitted. As shown in FIG. 11, a reflecting plate 70 made of aluminum plating is disposed to cover all the upper surface of a heat-medium jacket 36 serving as a base plate 22 of a processing vessel 4. A table 10 is disposed on the reflecting plate 70 through Peltier elements 24A.

In the third embodiment, a heat ray that has transmitted a wafer W and the table 10 is reflected upward by the reflecting plate 70, and thus the heat ray again contributes to heating of the wafer W. Since the heating efficiency can be improved because of the reflected ray, the wafer can be more rapidly heated. It goes without saying that the structures of the second embodiment shown in FIG. 10(A) and FIG. 10(B) can be applied to the table 10 in this embodiment. The reflecting plate 70 may be disposed between the table 10 and the Peltier elements 24A. Also in this embodiment, any kind of heating lamp 42A will do, that is, one or more kinds of lamps selected out of an ultraviolet discharge lamp, a halogen lamp, and an infrared lamp can be used.

Fourth Embodiment

Figure 12:
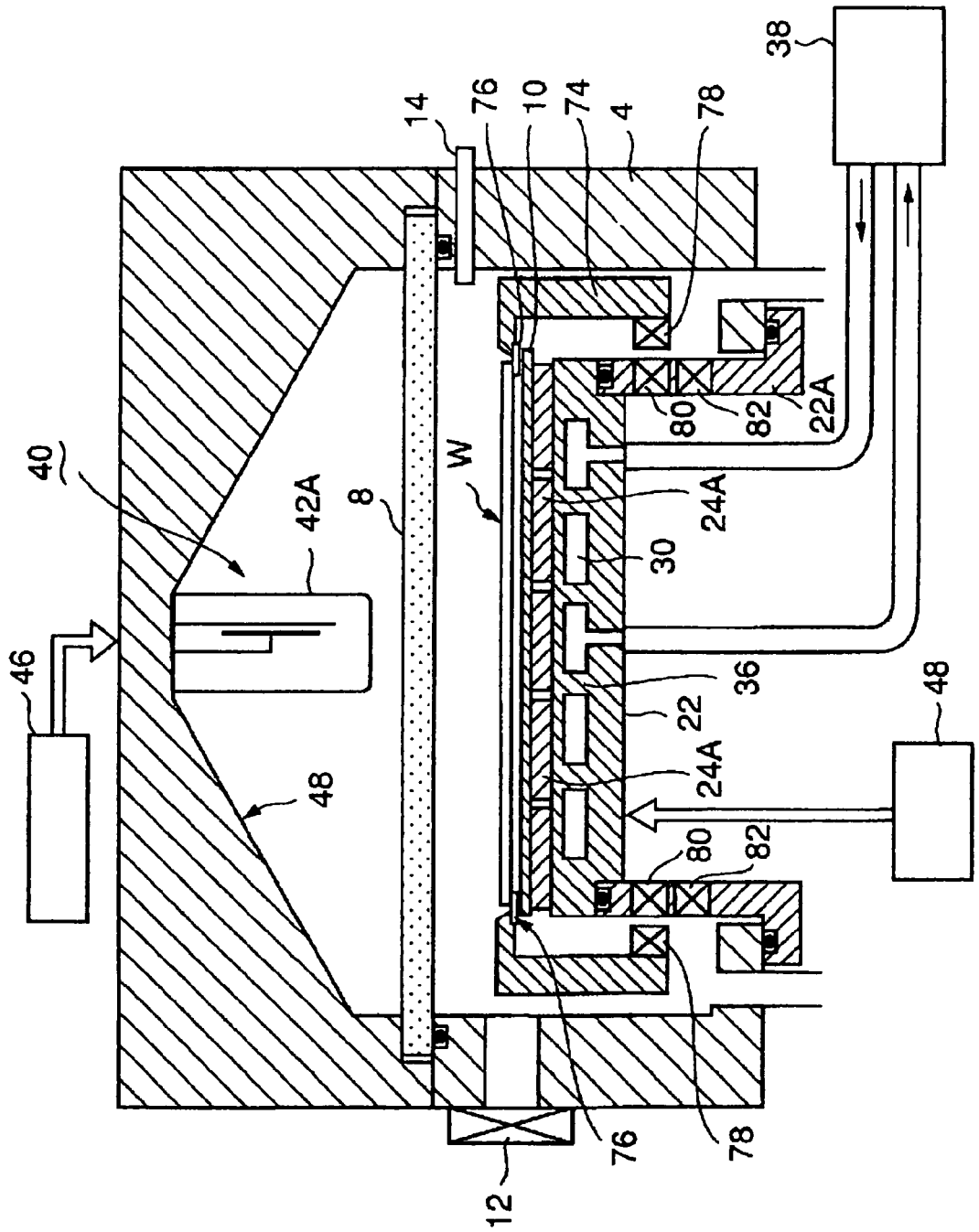
FIG. 12 is a schematic sectional view of a thermal processing apparatus in a fourth embodiment of the present invention.

Next, a fourth embodiment of the present invention is described below. FIG. 12 is a schematic sectional view of the fourth embodiment of the present invention. The same parts as those of FIG. 1 are depicted by the same reference numbers, and their description is omitted.

In the fourth embodiment, the fewer number of heating lamps 42A is used. In this illustration, one large-sized ultraviolet discharge lamp of high power is used to roughly heat a wafer by a large amount of heat rays. When a temperature of the wafer W is increased or decreased, electric currents to be applied to Peltier elements 24A are precisely controlled for every zone, or for each Peltier element 24A, so as to maintain a high intra-surface uniformity in the wafer temperature. As explained above, the electric power of the heating lamp 42A of the large-sized ultraviolet discharge lamp is duty-controlled.

In this embodiment, a base plate 22 is provided with a cylindrical leg part 22A to increase an overall height of the apparatus. A rotational holding base 74 is disposed around an upper periphery of the base plate 22. Thus, a wafer W can be rotated while it is being raised, if necessary. To be specific, the rotational holding base 74 made of, e.g., aluminum has a cylindrical shape. The rotational holding base 74 is disposed to surround upper peripheries of a base 10 and the base plate 22, such that the rotational holding base 74 is properly spaced apart from the table 10 and the base plate 22. Upper ends of the rotational holding base 74 are bent inward at substantially right angles. The suitable number of holding pieces 76 are horizontally extended from the bent ends. These holding pieces 76 can hold a lower peripheral portion of the wafer W as the need arises. A plurality of permanent magnets 78 are circumferentially arranged inside a lower end of the rotational holding base 74. An electric coil 80 for rotation is circumferentially disposed on the leg part 22A of the base plate 22 to be opposed to the permanent magnets 78. When an electric current is applied to the electric coil 80 to generate a rotating magnetic field, a part having the permanent magnets 78 magnetically connected to the electric coil 80, i.e., the rotational holding base 74 can be rotated.

An electric coil 82 for floatation is circumferentially disposed below the electric coil 80 for rotation. By electrifying the electric coil 82 for floatation according to need to magnetically generate a repulsive force between the electric coil 82 and the permanent magnets 78, the rotational holding base 74 can be floated upward. Since the rotational holding base 74 is equipped with an encoder or the like, not shown, a rotational speed and a rotational position of the rotational holding base 74 can be detected and controlled. Not-shown cut-outs are provided in a periphery of the table 10 that allow a vertical movement of the holding pieces 76.

When the wafer is heated and subjected to the annealing process by the thermal processing apparatus in this embodiment, the electric coil 82 for floatation is electrified to generate a repulsive force between the coil 82 and the permanent magnets 78, so that the rotational holding base 74 holding the wafer W with the holding pieces 76 is floated upward. Thus, the wafer W is floated and spaced apart from an upper surface of the table 10. As a material of the table 10, it is preferable to select such a material that reflects a heat ray from the lamp to return the same to the wafer, which is different from the above embodiments. For example, there may be used an Al material for an ultraviolet ray, a visible ray, and an infrared ray, and an Ag/Au material for the visible ray and the ultraviolet ray. In addition, a reflection enhancing coating material may be added to these materials. By electrifying the electric coil 80 for rotation to generate a rotational magnetic field, the rotational holding base 74 is rotated. According to this embodiment, the wafer W is heated and annealed while it is rotated and floated from the upper surface of the table 10. In this process, upper surfaces of Peltier elements 24A may be caused to generate heat so as to control the wafer temperature. That is, it is sufficient to heat only the wafer of a relatively smaller heat capacity, and hence a further rapid temperature elevation can be achieved.

When the wafer W is cooled after completion of the annealing process, supply of electricity to the heating lamp 42A is stopped, and supply of electricity to each of the electric coils 80 and 82 is stopped. Then, the rotational holding base 74 is lowered to bring the wafer W into with the table 10. Under this state, the wafer W is cooled. As described above, electric currents are applied to the Peltier elements 24A such that the upper surfaces thereof generate cold (negative) heat energy. Thus, the wafer W can be rapidly cooled.

In this embodiment, although the wafer W is raised with its peripheral portion being held by means of the holding pieces 76, the present invention is not limited thereto. For example, the table 10 may be constituted to be separable from the Peltier elements 24, and the table 10 may be raised with its peripheral portion being held by the holding pieces 76.

In the above embodiments, the annealing process is taken as an example of the heat process. However, the present invention can be naturally applied to other heat processes, such as a film-deposition process, an oxidation diffusion process, a modification process, and so on.

Although a silicon wafer is taken as an example of an object to be processed, the present invention can be naturally applied to a process of another semiconductor wafer such as a composite semiconductor, an LCD substrate, a glass substrate, and so on.

The invention claimed is:

1. A thermal processing apparatus that conducts a thermal process to an object to be processed at a temperature of 400° C. or more, the thermal processing apparatus comprising:

a processing vessel having a transmitting window in a top part thereof;

a table disposed in the processing vessel, the table supporting thereon the object opposed to the transmitting window;

a plurality of heating lamps disposed on above the processing vessel, the lamps heating the object by irradiating heat rays to the object through the transmitting window; and a thermoelectric converter disposed on the table and configured to at least cool the object, the thermoelectric converter being made of SiGe.

2. The thermal processing apparatus according to claim 1, wherein a heat-medium jacket containing a heat-medium flow path is disposed below the thermoelectric converter.

3. The thermal processing apparatus according to claim 1, wherein the thermoelectric converter is configured to heat the object by applying thereto an electric current in an opposite direction when the object is cooled.

4. The thermal processing apparatus according to claim 1, wherein:

the thermoelectric converter includes a plurality of thermoelectric transducers arranged in their respective zones of the table; and the thermal processing apparatus further comprises a transducer controller configured to control electric currents to be applied to the thermoelectric transducers for each zone of the table independently.

* * * * *